United States Patent
Oglesby

(10) Patent No.: US 6,448,787 B1
(45) Date of Patent: Sep. 10, 2002

(54) APPARATUS AND METHOD FOR MEASURING AND TUNING CIRCULARLY POLARIZED ANTENNAS

(75) Inventor: Stephen M. Oglesby, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 45 days.

(21) Appl. No.: 09/651,605

(22) Filed: Aug. 30, 2000

(51) Int. Cl.$^7$ ................................................ G01R 29/08
(52) U.S. Cl. ........................ 324/612; 324/637; 343/703; 343/700 MS
(58) Field of Search .......................... 342/165; 324/615, 324/608, 631, 632, 637, 612; 343/700 MS, 703, 780

(56) References Cited

U.S. PATENT DOCUMENTS

| | | | | |
|---|---|---|---|---|
| 4,968,983 A | * | 11/1990 | Maeda | ........................ 343/703 |
| 5,311,440 A | * | 5/1994 | Hess, Jr. | ...................... 324/612 |
| 5,432,523 A | * | 7/1995 | Simmers et al. | ............ 342/360 |

* cited by examiner

Primary Examiner—N. Le
Assistant Examiner—Vincent Q. Nguyen
(74) Attorney, Agent, or Firm—Nathan O. Jensen; Kyle Eppele

(57) ABSTRACT

An apparatus and method is disclosed for measuring and tuning circularly polarized antennas to simultaneously optimize axial ratio, resonant frequency, and impedance match. The antenna under test is mounted within the test apparatus. Located in the zenith and far field of the antenna are two rigidly mounted, orthogonal, and planar probes. The amplitude and phase developed by the antenna is measured at each probe. The computer calculates the zenith axial ratio from the measured amplitude and phase difference between the probes. The method further includes the steps to determine sense-of-rotation of the circular polarized wave, impedance match, and resonant frequency. This apparatus and method is an elegant, simple, and cost effective design that is applicable to any isolated circular polarized radiating element.

20 Claims, 8 Drawing Sheets

APPARATUS AND METHOD FOR MEASURING AND TUNING CIRCULARLY POLARIZED ANTENNAS

BACKGROUND OF THE INVENTION

This invention relates to antenna testing apparatus and more particularly to a system and procedure for measuring and tuning circularly polarized antennas to maximize their performance.

Antennas can be used in any system that transmits or receives radio frequency signals and are designed to optimize the radiation or reception of electromagnetic energy in some direction while suppressing it in others. During the antenna design process, various antenna properties are measured to evaluate compliance with design requirements. Three important properties of an antenna are polarization, input impedance, and resonant frequency.

Polarization of a radiated wave is that property of an antenna that describes the shape and orientation of the electric field vector as a function of time. To fully characterize the polarization of an antenna, it is necessary to determine the polarization ellipse, axial ratio, and sense-of-rotation of the electric field vector radiated by the antenna. For circular polarized antennas, axial ratio is an important criterion for the performance characterization of the antenna especially when measured at the zenith of the antenna because it is well understood that the zenith measurement can be used to infer axial ratio at other elevations. Since the axial ratio is defined as the ratio of the major axis to the minor axis of the circular wave polarization ellipse, a perfect circular polarized wave corresponds to an axial ratio equal to one, and deviations from unity deteriorate the performance of the antenna. Additionally, the sense-of-rotation or handedness describing the circle in the plane of polarization provides a complete description of the propagation pattern of the circular polarized wave. There are four primary methods that may be employed to measure polarization. These include the polarization-pattern method, rotating-source method, multiple-amplitude-component method, and phase-amplitude method. Typically, these methods require use of a specialized test facility, such as an anechoic chamber, complex instrumentation for frequency stability, elaborate computer controlled electromechanical systems to rotate the probe or antenna element, and are extremely time consuming, especially if tuning of the antenna element or multiple polarization parameter measurements are required. Furthermore, these methods require translating and resolving multiple coordinate reference systems, which may lead to inaccuracies. Finally, in a production environment, utilizing any of these methods would require substantial infrastructure and personnel investment.

The input impedance of the antenna is another important factor in considering maximum power transfer and useful bandwidth of the antenna at its resonant frequency. It is generally a function of frequency and is affected by the antennas physical geometry, method of excitation, and proximity to other objects. It is measured at a single port of the antenna and should be obtained under normal operating conditions. Furthermore, impedance becomes a significant parameter to control for small high frequency operating antennas. Measurement of input impedance can be performed using impedance bridges or broadband network analyzer systems that automatically display complex reflection and transmission parameters, but is accomplished independently of other antenna tests and often in special configurations and ranges.

The above mentioned systems determine circular polarization axial ratio, sense-of-rotation of the polarized wave, impedance matching, and resonant frequency, but require elaborately equipped test facilities, particular configurations for each test, specialized operator expertise, and are time consuming, especially when antenna adjustments are required. The present invention is an antenna test apparatus and method in which the fundamental figures of merit for antenna performance prediction, zenith axial ratio, sense of polarization rotation, impedance, and resonant frequency, can be determined, and tuned if necessary, simultaneously for an antenna element in a production environment requiring only simple test fixtures, vector automated network analyzer, and computer.

SUMMARY OF INVENTION

The present invention relates to antenna performance measurement and tuning for circularly polarized antenna elements. In one aspect of the invention, the amplitude and phase of signals received at the test fixture probes from the illuminating wave emitted by the antenna under test (AUT) are processed to determine its zenith axial ratio and sense-of-rotation. In another aspect of the invention, the antenna impedance matching and resonant frequency characteristics are measured. An antenna test apparatus is disclosed which comprises a fiberglass epoxy support structure, radio frequency (RF) echo absorber material, conducting ground plane, and antenna probe, that, in combination with a vector automated network analyzer, present amplitude and phase data that is used to determine zenith axial ratio, sense-of-rotation, impedance matching properties, and resonant frequency of the AUT.

It is an object of the present invention to provide a method and means for simultaneously determining the zenith axial ratio, sense-of-rotation, impedance, and resonant frequency of a circularly polarized antenna, which are fundamental figures of merit for antenna performance predictability.

It is a feature of the present invention to provide a test apparatus that is simple to assemble, reliable, occupies minimal space, uses common and familiar test instrumentation, and requires no time-consuming reconfiguration of the AUT for multiple antenna parameter measurements.

It is an advantage of the present invention to provide a method of analysis that is accomplished quickly, readily understood, not prone to errors, and applicable to a broad family of circularly polarized antennas, which permits optimal antenna performance evaluation in a field or production environment.

These and other objects, features, and advantages are disclosed in the specification, figures, and claims of the present invention.

DETAILED DESCRIPTION

Figure 1:
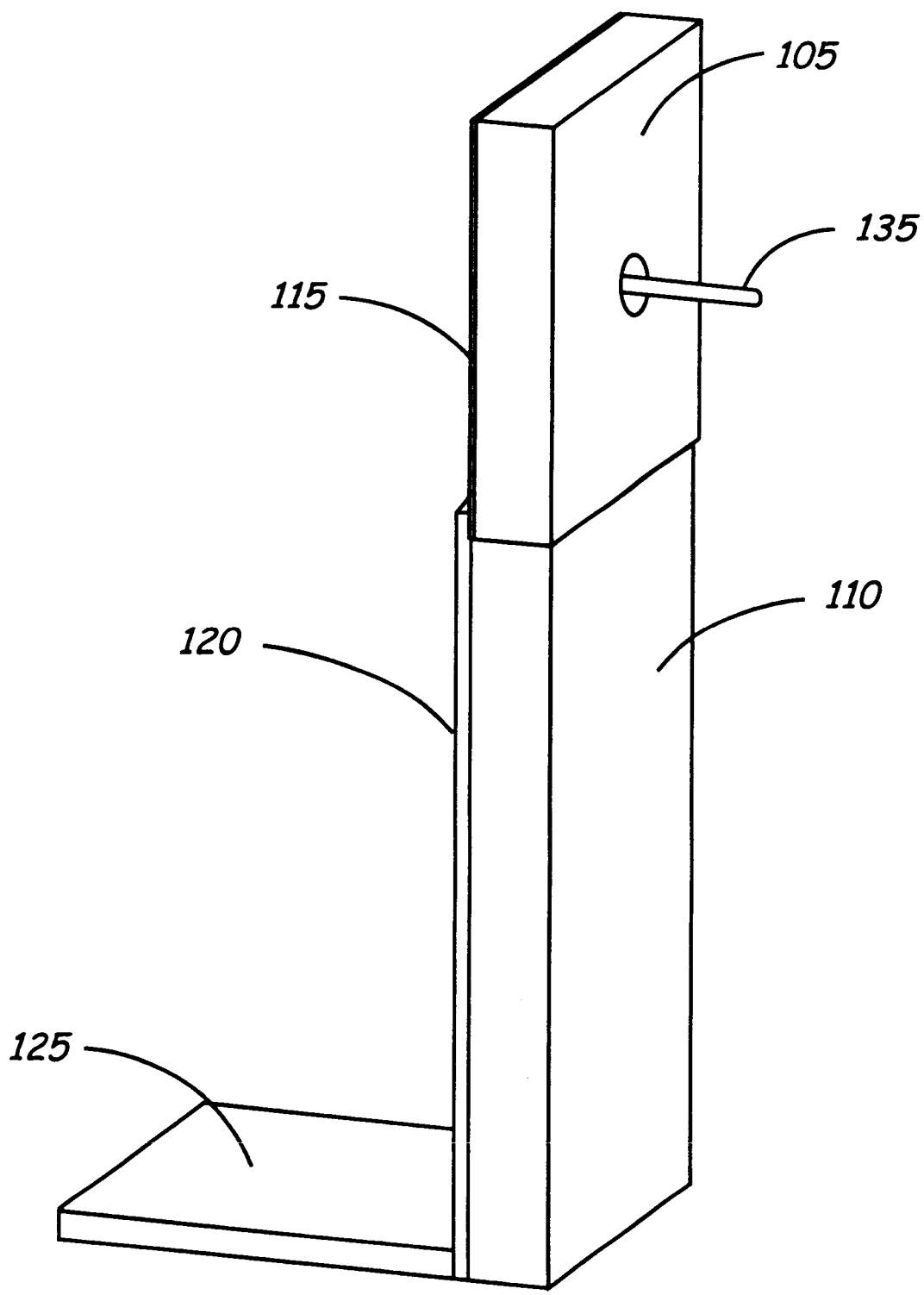
FIG. 1 is a pictorial representation of an antenna test fixture constructed in accordance with preferred embodiments of the present invention.

Referring now to the drawings wherein like numerals refer to like matter throughout, FIG. 1 shows an antenna test fixture that incorporates the teachings of the present invention. The antenna test fixture is comprised of a fiberglass epoxy base 125, a vertical fiberglass epoxy support panel 120, a conductive ground plane 115 constructed from metal of sufficient conductivity for the frequency of operation, highly linear RF electric (E)-field probe 135, which may be the center pin extension of a coaxial connector, and thick RF echo absorber material 105 and 110 attached to support panel 115 and 120 respectively. For an antenna operating near 1.6 GHz, the fixture's dimensions are approximately four-inches wide by nine-inches high, RF echo absorber material 105 and 110 approximately three-quarter inch in thickness, and E-field probe 135 placement centered about eight and three-quarter inches above the base 125, which is in the electric far-field of the operating frequency of the AUT that is placed below the probe and adjacent to base 125 and RF echo absorber material 110.

Although depicted for an antenna designed to operate near 1.6 GHz, the advantages of the present invention are equally applicable to any microwave antenna operating range. In those instances, thickness of the RF echo absorber material 105 and 110, physical dimensions of the base 125, support panel 120, conductive ground plane 115, and E-field probe 135 positioning would be based on the operating range of the AUT.

Figure 2:
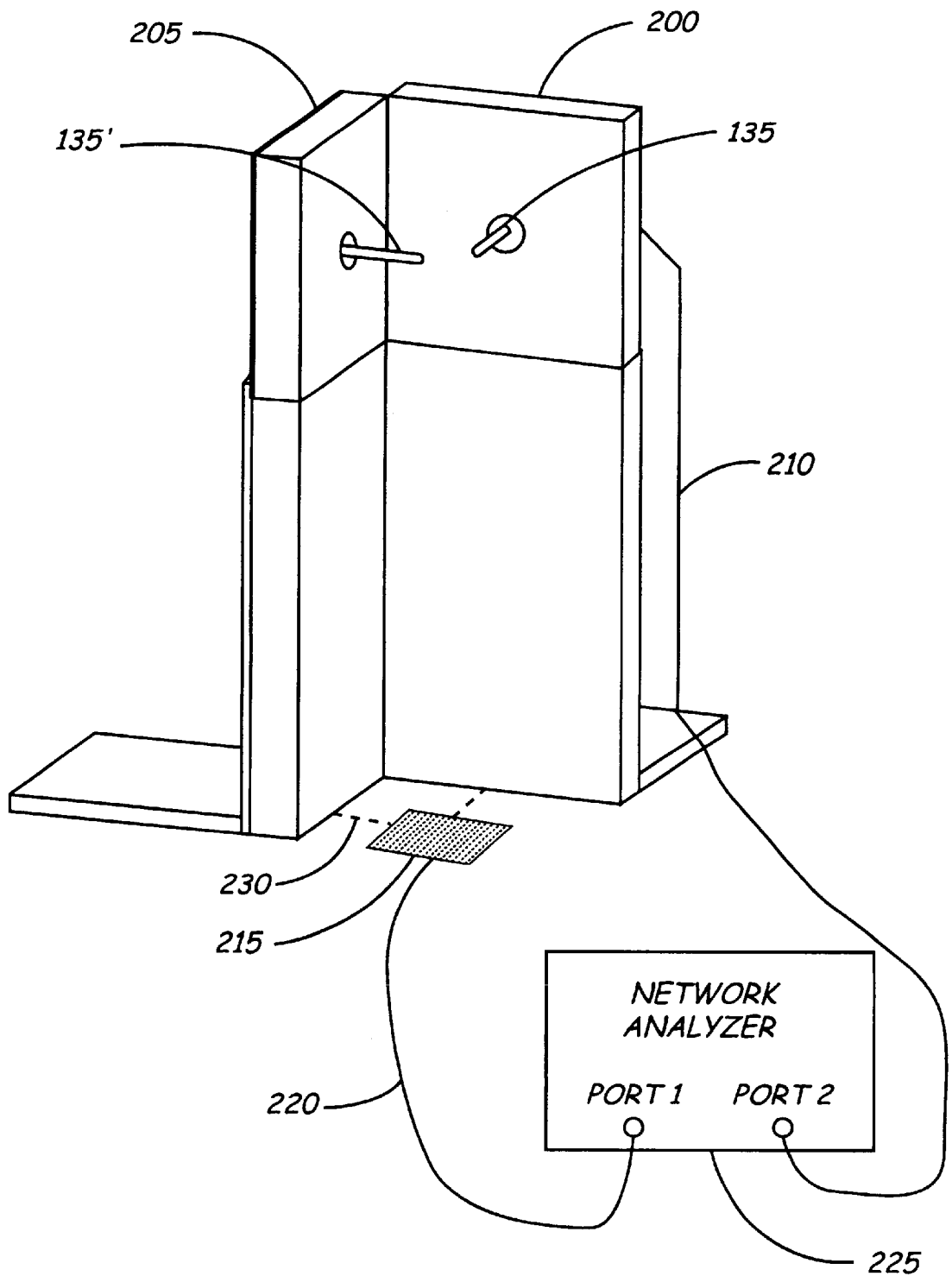
FIG. 2 is a diagrammatic illustration of antenna test fixture arrangement and instrumentation circuitry of the present invention to perform E-field Probe-1 $S_{21}$, amplitude and phase measurement for the AUT.
Figure 3:
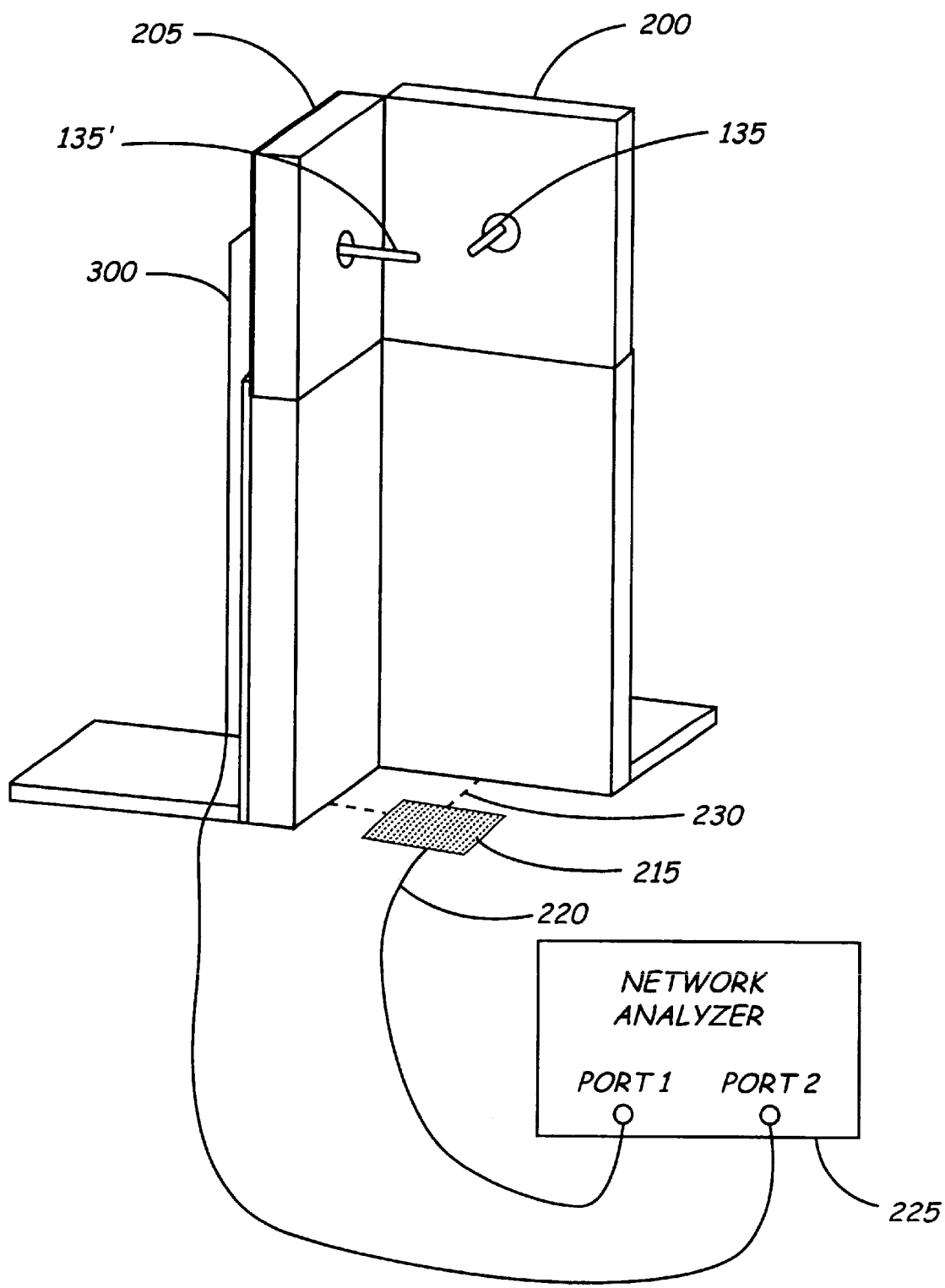
FIG. 3 is a first diagrammatic illustration of antenna test fixture arrangement and instrumentation circuitry of the present invention to perform E-field Probe-2 $S_{21}$ amplitude and phase measurement, sense-of-rotation determination of the polarization wave, and $S_{11}$ impedance and resonant frequency measurements for the AUT.

There is shown in FIG. 2 and FIG. 3 an antenna test and measurement system comprising two antenna test fixtures 200 and 205, which contain the components described in FIG. 1, an orthogonal reference grid 230 to align the reference axes of the AUT 215 and E-field Probe-1 135 contained in 200 and E-field Probe-2 135' contained in 205, vector automatic network analyzer (referred henceforth as network analyzer) 225, signaling cable 210 to couple signals from the network analyzer 225 to E-field Probe-1 135 in test fixture 200, signaling cable 220 to couple signals from the network analyzer 225 to the AUT 215, and signaling cable 300 to couple signals from the network analyzer 225 to E-field Probe-2 135' in test fixture 205.

It should be noted that the physical arrangement of antenna test fixtures 200 and 205 are adjustable, and orthogonal reference grid 230 expandable, to provide a means to set the E-field probes to be equal, but different distances from the center of the AUT. Thus, the test system is applicable to a large class of antennas, multi-element or larger size circular polarized radiating element, which can be accommodated in the test apparatus without coordinate system redefinition, as long as the antennas are electrically small as a function of wavelength.

Figure 4:
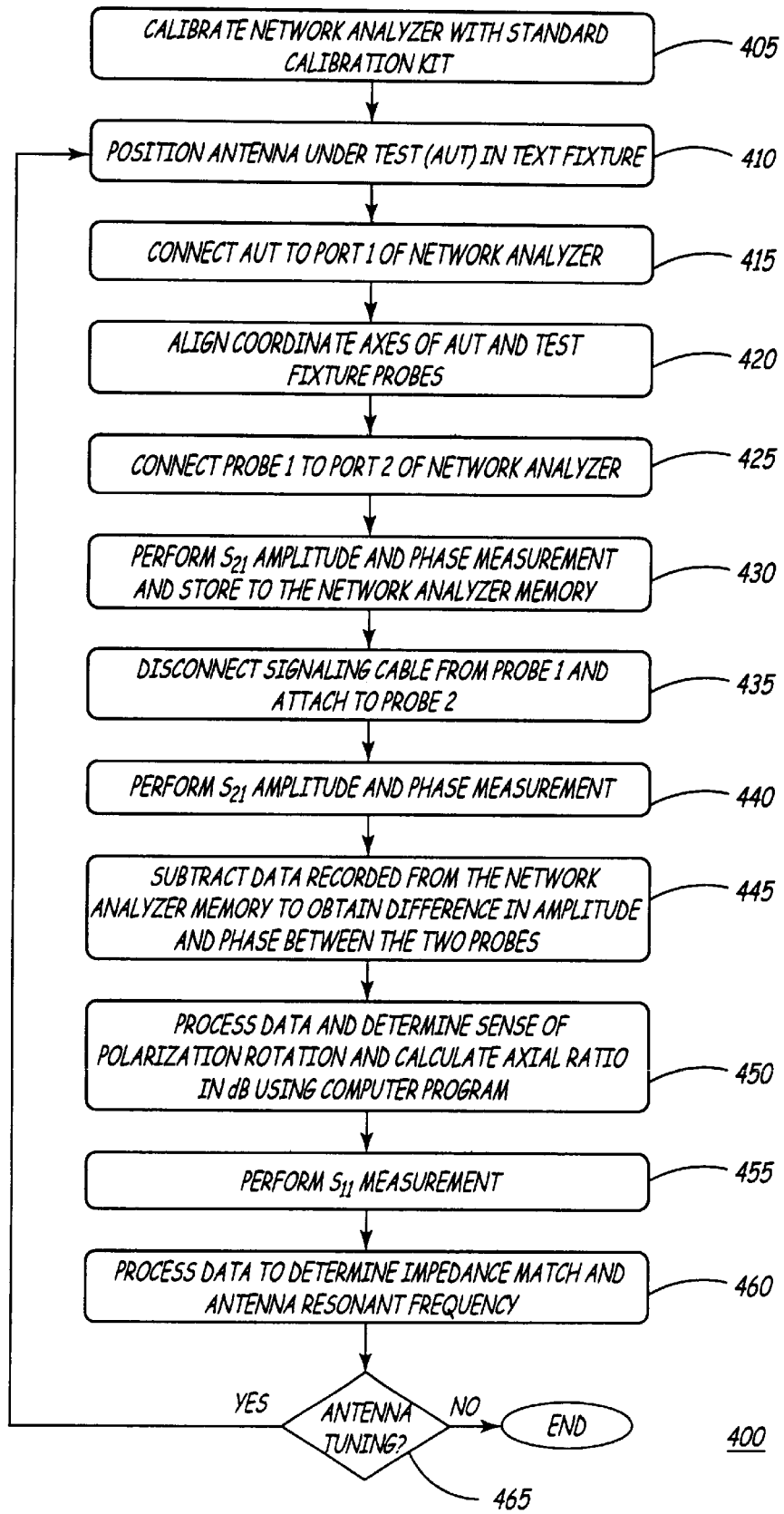
FIG. 4 is a flow chart of the method according to the present invention for simultaneously determining axial ratio, sense-of-rotation, impedance match, and resonant frequency for the AUT.

FIG. 4 depicts a flowchart 400 that describes a sequence to measure and tune a circular polarized antenna to be tested. The initial step 405 is to calibrate the network analyzer 225 to the ends of the signaling cables 210 and 220 (FIG. 2) with a standard calibration kit, which is apparent to one of ordinary skill in the art. This is accomplished with the antenna test fixtures 200 and 205 approximately oriented as shown in FIG. 2 and positioned near the network analyzer 225. Step 410 is to position the AUT 215 in the test fixture in approximate orientation with the reference grid 230. Step 415 is to connect signaling cable 220 between Port 1 of the network analyzer 225 and the AUT 215 (see FIG. 2). Signaling cable 220 will remain connected to the AUT throughout the remaining steps described in FIG. 4. Step 420 is to align the coordinate axes of the AUT 215 and E-field probes 135 and 135' contained in test fixtures 200 and 205, (FIG. 2), and to secure test fixtures 200, 205 and AUT to prevent movement during the measurement process. The E-field probe axis alignment must be directly over the zenith of the coordinate axis of the AUT; however, E-field probe tip distance from the origin of the coordinate axis is not critical, but E-field probes (135 and 135') must be positioned equal distance from the coordinate axis origin formed by both E-field probes and the AUT.

Operation of the network analyzer, disconnecting and reconnecting probe cabling, recording of the antenna measurement parameters, processing of the data, and tuning of the AUT required of FIG. 4, Steps 425–460, may take a number of forms, which are readily apparent to one of ordinary skill in the art.

Furthermore, it should be noted that the method of this invention to determine the zenith axial ratio of the circular polarized AUT for FIG. 4, Step 425 through Step 450 discussed later, is based upon the relationship that elliptically polarized waves can be mathematically decomposed into two linearly polarized waves. For a perfect circular polarized wave, the amplitudes would be equal with a 90-degree phase difference between the linear waves. Thus, from the geometry of the ellipse and magnitude of the amplitude and phase difference between the linear polarized waves, the axial ratio can be determined.

The novelty of this invention is the measurement of separate complex insertion loss measurements $S_{21}$, transmission gain in dB from Port 1, AUT, to Port 2, E-field probes (135 and 135', respectively), in the network analyzer that decompose the circular polarized wave into two orthogonal components in the x-direction and y-direction of the reference coordinate system. In one measurement, Port 2 is connected to E-field Probe-1 (135), x-axis reference, contained in test fixture 200, FIG. 2, and in the second measurement, Port 2 is connected to E-field Probe-2 (135'), y-axis reference, contained in test fixture 205, FIG. 3. The network analyzer may be used to determine the amplitude and phase difference between the measurements from E-field Probe-1 and E-field Probe 2. The calculation of axial ratio from these parameters is calculated from the procedure described by K. Gupta, Computer-Aided Design of Microstrip Antennas and Arrays (1991), whose works are incorporated herein by this reference. Equation (1) through Equation (3) shows Gapta's method for axial ratio determination.

$$OA = \text{Major Axis} = \sqrt{\frac{1}{2}\left(E_x^2 + E_y^2 + \sqrt{E_x^4 + E_y^4 + 2E_x^2 E_y^2 \cos(2\Delta\phi)}\right)} \quad (1)$$

$$OB = \text{Minor Axis} = \sqrt{\frac{1}{2}\left(E_x^2 + E_y^2 - \sqrt{E_x^4 + E_y^4 + 2E_x^2 E_y^2 \cos(2\Delta\phi)}\right)} \quad (2)$$

$$\text{Axial Ratio } (AR)_{dB} = 20\log\left(\frac{OA}{OB}\right) \text{ where,} \quad (3)$$

Figure 5A:
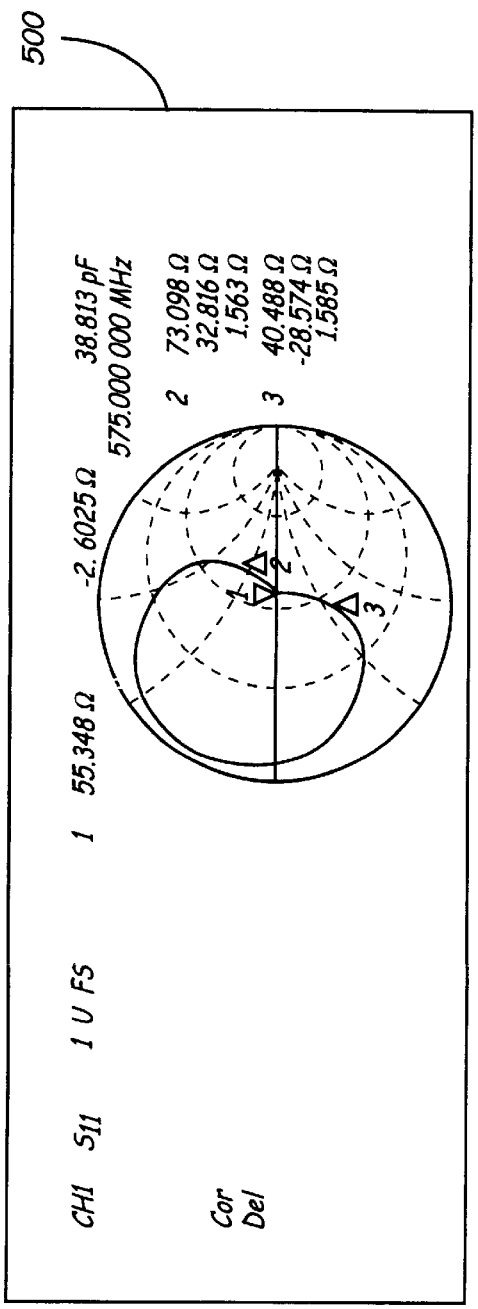
FIGS. 5 and 5B depict an impedance polar plot and a resonant frequency graph generated by the vector automatic network analyzer for an AUT.
Figure 5B:
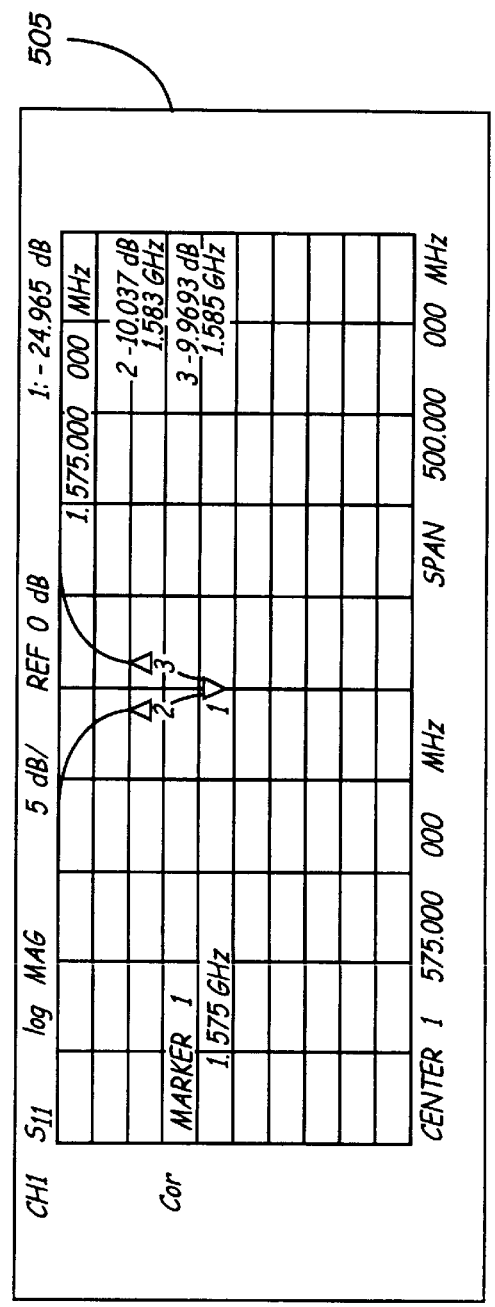
Figure 6A:
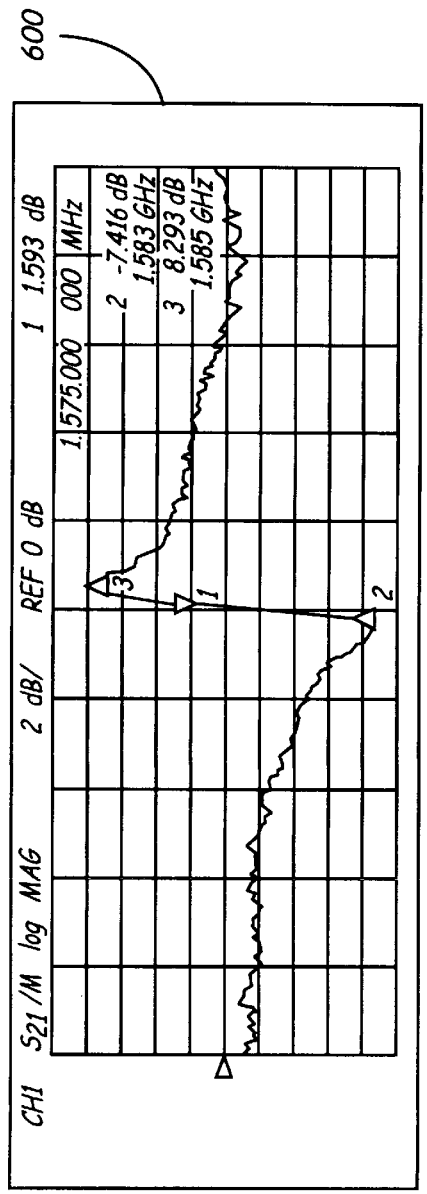
FIGS. 6A and 6B are graphs of the delta amplitude and delta phase measurement obtained from the vector automatic network analyzer for an AUT.
Figure 6B:
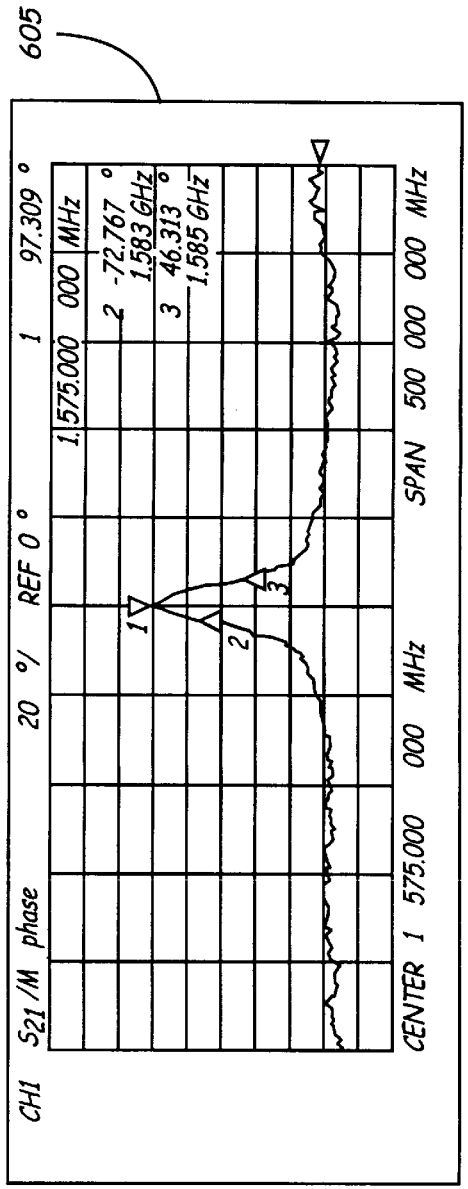
Figure 7:
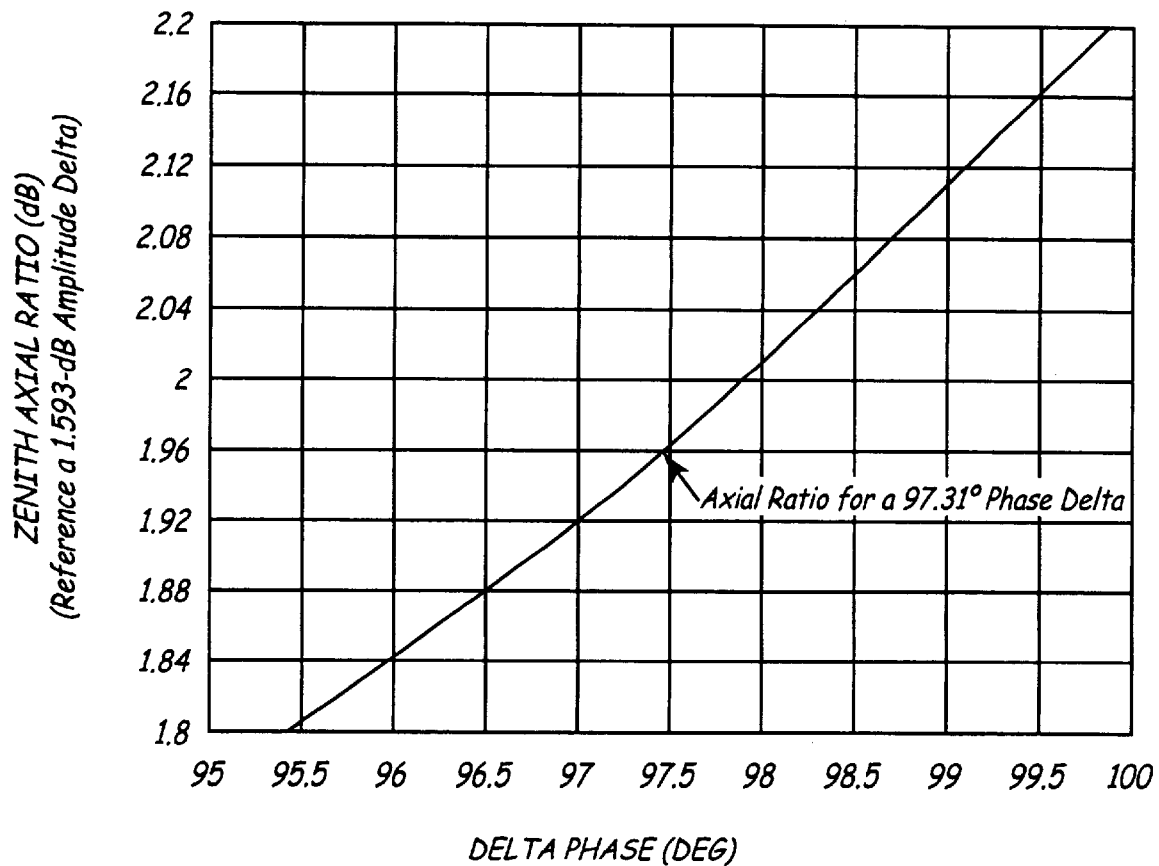
FIG. 7 is a graph of Zenith Axial Ratio vs. Delta Phase illustrating the embodiments of the test device and method according to the invention.

$Ex = 10^{\left(\frac{P_x}{20}\right)} = 1$ Electric field strength in the x-direction, where $P_x$ = E-field Probe-1's $S_{21}$ amplitude measurement normalized to 0 dB $Ey = 10^{\left(\frac{P_y}{20}\right)}$ Electric field strength in the y-direction, where $P_y = S_{21}$ Amplitude Difference Measurements, (E-field Probe-1 – E-field Probe-2), converted from dB to magnitude $\Delta\varphi =$       $S_{21}$ Phase Difference Measurements, (E-field Probe-1 – E-Field Probe-2), converted from degrees to radians Configuration of the antenna system for measuring the first $S_{21}$ measurement is accomplished in Step 425, FIG. 4. In this step, signaling cable 210, FIG. 2, is connected between the network analyzer 225 and E-field Probe-1 135 in test fixture 200. Step 430 executes the first $S_{21}$ measurement, which may be stored in the network analyzer memory. After the first $S_{21}$ measurement is taken and recorded, Step 435 is accomplished to disconnect the signaling cable 210, FIG. 2, from the E-field Probe-1 135 connection terminal in test fixture 200 and reconnect the signaling cable 300, FIG. 3, to a connection terminal on E-field Probe-2 135' in test fixture 205. Now, the antenna system is configured for measuring the second $S_{21}$ measurement and $S_{11}$ signal reflections off Port 2, which is connected to the AUT 215 to simultaneously determine impedance match and resonant frequency. Step 440 is performed to measure the $S_{21}$ amplitude and phase at E-field Probe-2 135', which may be recorded or retained in the network analyzer data buffer. Step 445 is performed such that the difference (delta) between the $S_{21}$ measurements accomplished in Step 430–440 is obtained, which may be implemented directly by the network analyzer's "data minus memory" function. FIG. 6A and 6B depict a plot 600 of the delta amplitude of 1.593-dB and a plot 605 of the delta phase of 97.31° for a typical microstrip antenna designed to operate near 1.6 GHz. Step 450 further processes the data that was obtained in Step 445 to resolve the sense-of-rotation or handedness of the circular polarized wave, which is determined from the sign of the difference between E-field Probe-1 and E-field Probe-2 phase measurements, positive or negative, and to calculate the axial ratio of the AUT using Equations (1), (2) and (3), which may be accomplished using a computer. It is also noted that if the delta amplitude difference is fixed and the phase difference varied, a plot of Zenith Axial Ratio vs. Delta Phase conveniently displays the axial ratio as a function of phase difference between the two linear fields decomposed from the circular polarized wave of the AUT. FIG. 7 illustrates a Zenith Axial Ratio vs. Delta Phase curve for the delta amplitude obtained from 600, FIG. 6. The delta phase value depicted in chart 605, FIG. 6, would correspond to an ordinate value of 97.310 in FIG. 7. Thus, the axial ratio for this antenna would be read directly from the graph as 1.96-dB, which is noted in FIG. 7. Step 455 is the final network analyzer measurement $S_{11}$ that permits the reflection properties, impedance and resonant frequency, of the AUT 225, FIG. 3, to be simultaneously accomplished in the test configuration. Step 460 is to determine the impedance of the antenna and resonant frequency from the $S_{11}$ measurement data obtained in Step 455. The processed data for impedance matching is displayed as a polar plot of the form 500, FIG. 5A, for a microstrip antenna operating near 1.6 GHz. The processed data for the resonant frequency is displayed as a graph 505, FIG. 5B.

Upon completion of Step 460, FIG. 4, a conditional process 465 determines if additional antenna tuning is needed for parameters obtained that were outside the design specifications for the AUT. If antenna adjustments are made, Steps 410–460 are repeated; otherwise the antenna measurement test terminates 400 and the AUT may be removed.

Figure 8:
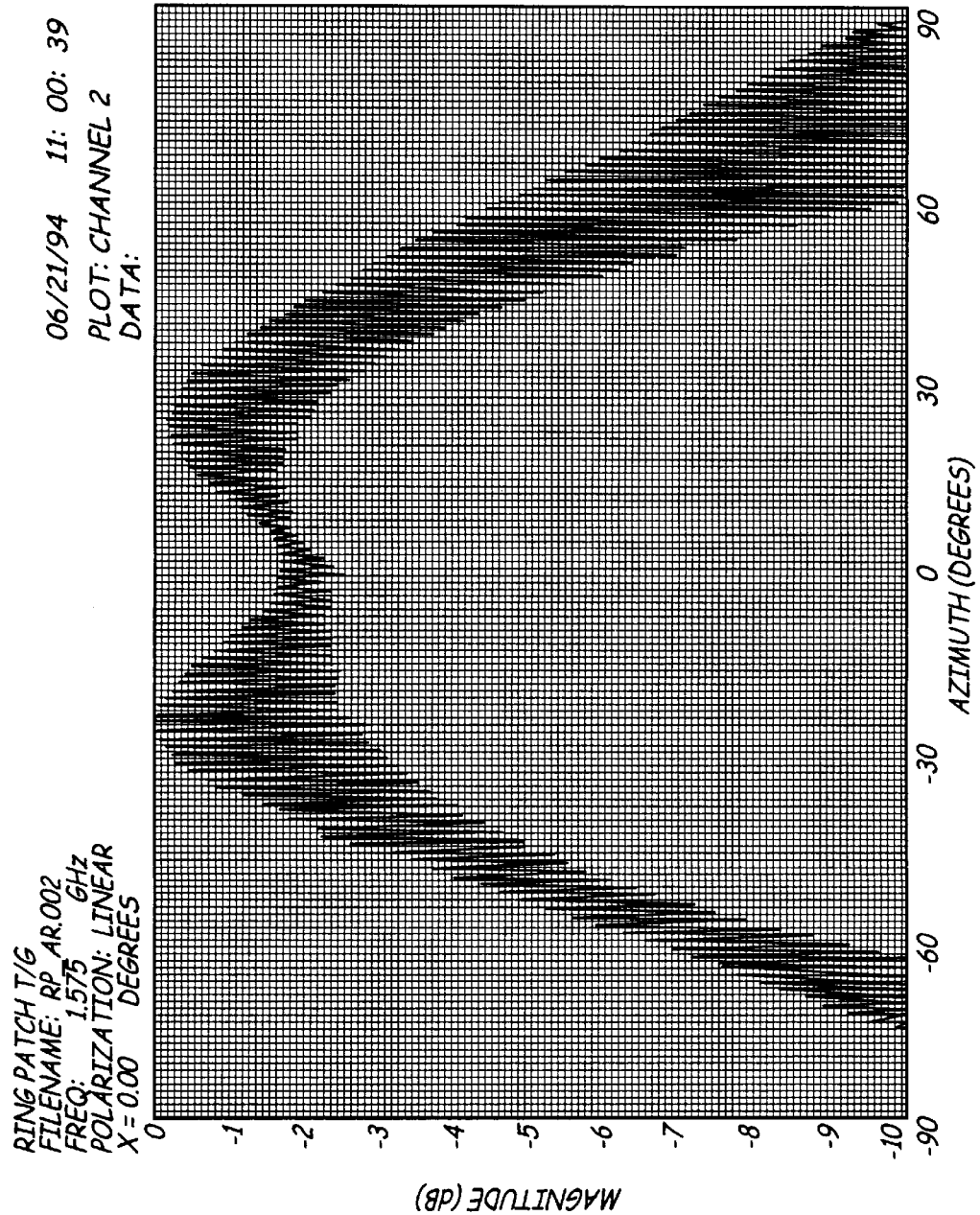
FIG. 8 illustrates a conventional polarization plot obtained from using the rotating source method in an anechoic chamber for an AUT, which shows conformity to the present invention method.

Proper operation of the method and apparatus of the present invention requires that the antenna performance parameters obtained closely correlate with measurements obtained from one of the methods outlined in IEEE Std. 149–1979, Standard Test Procedures for Antennas. FIG. 8 depicts an axial plot of the same antenna used to obtain the data of FIGS. 5–7, but is measured in an anechoic chamber by means of the rotating linear source method. The two measurements have close agreement.

It should be also noted that in the case of a rectangular microstrip patch antenna, the measurements show that increasing the size of one side of the patch increases the phase delta, while increasing the size of the orthogonal side of the patch reduces the phase delta. Additionally, increasing either side of the rectangular microstrip patch decreases the antenna resonant frequency. It can be readily seen from this information the direction required to tune the antenna for the best axial ratio at a given frequency.

It is understood that, while the detailed drawings, specific examples, and particular values given describe preferred exemplary embodiments of the present invention, they are for the purpose of illustration only. The apparatus and method of the present invention is not limited to the precise details of the conditions disclosed. Accordingly, changes may be made to the details disclosed without departing from the spirit of the invention the scope of which should be determined by the following claims.

I claim:

1. A test and measurement system for antennas comprising:
   a means to support a plurality of linear polarized antenna probes in an orthogonal and planar arrangement attached to conductive ground planes located in the far-field of the antenna under test (AUT);
   a means to align the AUT and antenna probe reference axes;
   a network analyzer capable of measuring amplitude and phase of a radiated wave; and
   a means to provide signal coupling to or from the AUT, antenna probes, and network analyzer.

2. The system of claim 1 wherein said test and measurement system is applicable to circular polarized antenna radiating elements that are electrically small as a function of wavelength.

3. The system of claim 1 wherein said antenna probe supports are adjustable to different distances from the AUT.

4. The system of claim 1 wherein the alignment of the said AUT and probe reference axes is expandable to accommodate different size antennas to be tested.

5. A method for simultaneously measuring multiple circular polarized antenna performance parameters, which comprises;
   positioning an antenna to be tested in the test and measurement system;
   aligning the coordinate axes of the AUT and antenna probes;
   providing test signals to be radiated from the network analyzer;
   recording of test signals;
   determining sense-of-rotation for the AUT;
   calculating amplitude and phase difference among antenna probes; and
   translating measured data into antenna performance parameters.

6. The method of claim 5 wherein said alignment of coordinate axes determines AUT elevation axial ratio.

7. The method of claim 5 wherein said determining sense-of-rotation for the AUT is from phase signal polarity changes between any two orthogonal antenna probes.

8. The method of claim 5 wherein said calculating of amplitude and phase difference is accomplished between any two orthogonal antenna probes.

9. The method of claim 5 wherein said recording of test signals is accomplished sequentially among the antenna probes.

10. The method of claim 9 wherein the recorded test signal at each probe is comprised of amplitude and phase data.

11. The method of claim 5 wherein said recording of test signals is accomplished at the AUT.

12. The method of claim 11 wherein the recorded test signal at the AUT is comprised of reflection and transmission coefficient data.

13. The method of claim 5 wherein said translating measured data determines axial ratio, impedance, and resonant frequency of the AUT.

14. The method of claim 13 wherein the axial ratio is determined from the translated amplitude and phase difference data between any two orthogonal probes.

15. The method of claim 13 wherein the impedance matching and resonant frequency of the AUT is determined from the translated reflection and transmission coefficient data.

16. An antenna test fixture assembly, having a plurality of units, each unit comprising:
   a base component;
   a vertical plane component, coupled in a perpendicular fashion to said base member;
   a ground plane component, coupled to said vertical plane member at a distal region of the vertical plane opposite to the vertical plane and base component coupling;
   radio frequency absorption material affixed to the primary surfaces of the vertical and ground plane components;
   an electric field probe, affixed to and protruding away from a primary surface of the ground plane component; and
   a signal cable connector coupled to the electric field probe for the transmission of a detected radiated signal from an antenna unit under test to a signal analyzer;
   wherein the electric field probes are in the far-field of an antenna unit under test and in an orthogonal relationship to each other and the antenna under test.

17. The assembly of claim 16, wherein the electric field probe is the center pin extension of a coaxial connector.

18. The assembly of claim 16, wherein the ground plane is made of copper.

19. The assembly of claim 16, wherein the vertical plane and base component are of fiberglass epoxy composition.

20. The assembly of claim 16, wherein the total length and width of the vertical plane and grounding plane as assembled, approximates nine inches by four inches.

* * * * *